United States Patent [19]
O'Neill, Jr.

[11] Patent Number: 5,969,681
[45] Date of Patent: Oct. 19, 1999

[54] EXTENDED BANDWIDTH DUAL-BAND PATCH ANTENNA SYSTEMS AND ASSOCIATED METHODS OF BROADBAND OPERATION

[75] Inventor: Gregory A. O'Neill, Jr., Apex, N.C.

[73] Assignee: Ericsson Inc., Research Triangle Park, N.C.

[21] Appl. No.: 09/092,311

[22] Filed: Jun. 5, 1998

[51] Int. Cl.$^6$ ..................................................... H01Q 1/38
[52] U.S. Cl. ................................. 343/700 MS; 343/850; 343/860; 455/283
[58] Field of Search ............................ 343/700 MS, 702, 343/713, 850, 853, 860; 342/372, 375; 455/283, 284, 550, 575; H01Q 1/38

[56] References Cited

U.S. PATENT DOCUMENTS

| | | | |
|---|---|---|---|
| 4,008,479 | 2/1977 | Smith | 343/895 |
| 4,031,540 | 6/1977 | Borys, Jr. | 343/860 |
| 4,080,569 | 3/1978 | Cameron | 343/850 |
| 4,218,682 | 8/1980 | Yu | 343/700 MS |
| 4,316,194 | 2/1982 | De Santis et al. | 343/700 MS |
| 4,554,554 | 11/1985 | Olesen et al. | 343/895 |
| 4,771,291 | 9/1988 | Lo et al. | 343/700 MS |
| 4,783,661 | 11/1988 | Smith | 343/700 MS |
| 4,809,008 | 2/1989 | Gunton | 343/700 MS |
| 4,864,314 | 9/1989 | Bond | 343/700 MS |
| 4,924,236 | 5/1990 | Schuss et al. | 434/700 MS |
| 5,099,249 | 3/1992 | Seavey | 343/700 MS |
| 5,138,331 | 8/1992 | Josypenko | 343/895 |
| 5,255,005 | 10/1993 | Terret et al. | 343/895 |
| 5,319,378 | 6/1994 | Nalnandian et al. | 343/700 MS |
| 5,463,404 | 10/1995 | Wall | 343/700 MS |
| 5,561,435 | 10/1996 | Nalbandian et al. | 343/700 MS |
| 5,598,168 | 1/1997 | Evans et al. | 343/700 MS |
| 5,815,119 | 9/1998 | Helms et al. | 343/700 MS |

FOREIGN PATENT DOCUMENTS 2 272 575    5/1994    United Kingdom .

OTHER PUBLICATIONS

R.M. Fano, Theoretical Limitations on the Broadband Matching of Arbitrary Impedances, Tehcnical Report No.41, Massachusetts Institute of Technology, (Jun. 1947).

Thomas R. Cuthbert, Jr., Broadband Impedance Matching—Fast and Simple, *RF Matching Networks*, Nov. 1994, pp. 38–50.

William E. Sabin, Broadband HF Antenna Matching with ARRL Radio Designer, *QST*, Aug. 1995, pp. 33–36.

Maximising Monopole Bandwidth, *Electronic World & Wireless World*, Dec. 1994.

Robert J. Dehoney, Program Synthesizes Antenna Matching Networks for Maximum Bandwidth, *QST*, May 1995.

Constantine A. Balanis, *Antenna Theory Analysis and design*, pp. 723–779, (Jan. 1998).

David F. Bowman, Impedance Matching and Broadbanding, *Antenna Engineering Handbook*, pp. 43–1–43–31, (1984).

David M. Pozar, Daniel H. Schaubert; *Microstrip Antennas—The Analysis and Design of Microstrip Antennas and Arrays*, pp. 105–116, 167–175, 178–179 (1995).

*Primary Examiner*—Don Wong
*Assistant Examiner*—Tho Phan
*Attorney, Agent, or Firm*—Myers Bigel Sibley & Sajovec

[57] ABSTRACT

Patch antenna systems for half-duplex communications which are capable of providing a positive gain, quasi-hemispherical antenna pattern over widely separated transmit and receive frequency bands. The antenna systems according to the present invention generally comprise a patch antenna, transmit and/or receive circuit branches for tuning the patch antenna to resonate in separate transmit and receive frequency bands, and disconnection means for electrically isolating the transmit circuit branch from the antenna during periods of reception and for electrically isolating the receive circuit branch from the antenna during periods of transmission. Matching means, which preferably are implemented as part of the transmit and receive circuit branches, may also be provided for increasing the operating bandwidth of the antenna in both the transmit and receive frequency bands. In a preferred embodiment, the patch antenna transmits and receives circularly polarized waveforms, and may be fed by a single feed or in quadrature via orthogonally located feed points.

28 Claims, 9 Drawing Sheets

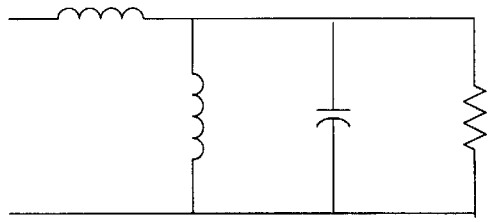
Equivalent Circuit for
Microstripline Feed
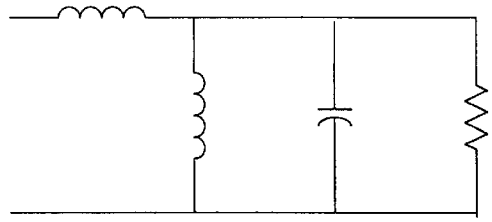
Equivalent Circuit for
Probe Feed
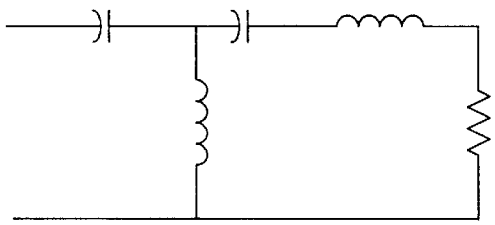
Equivalent Circuit for
Aperture Coupled Feed
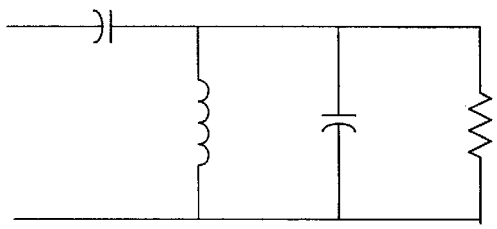
Equivalent Circuit for
Proximity Coupled Feed
Figure 4

EXTENDED BANDWIDTH DUAL-BAND PATCH ANTENNA SYSTEMS AND ASSOCIATED METHODS OF BROADBAND OPERATION

FIELD OF THE INVENTION

The present invention relates generally to antenna systems for radiotelephones. More particularly, the present invention relates to patch antenna systems which are particularly well-suited for use with mobile radiotelephone user handsets.

BACKGROUND OF THE INVENTION

Cellular communication systems are well known in the art for providing wireless communications links between mobile telephone users and stationary users or other mobile users. In typical cellular systems, wireless transmissions from mobile users are received by one of a local network of base station terminals. The base station or "cell" receiving the signal then retransmits it for reception by the intended receive terminals, either directly or via the cellular or local telephone systems.

As cellular communications systems generally rely on line-of-sight communications links, many cells are typically required to provide communications coverage for a large geographic area. The cost associated with providing large numbers of cells, however, may prohibit the use of cellular systems in sparsely populated regions or areas where there is limited demand for cellular service. Moreover, even in areas where cellular service is not precluded by economic considerations, "blackout" areas often arise in traditional cellular systems due to local terrain or weather conditions.

As such, systems that integrate cellular and satellite networks have been proposed for providing communications for mobile users over a large geographical area where cellular service may be impractical. In these proposed systems, which include the European-African Telephone ("EAST") System and the Asian Cellular Satellite ("ACES") System, terrestrial-based cellular stations would be provided in high traffic areas, while an L-Band satellite communications network would provide service to remaining areas. In order to provide both cellular and satellite communications, the user terminal handsets used with this system would include both a satellite and a cellular transceiver. Such a combined system could provide full communications coverage over a wide geographic area without requiring an excessive number of terrestrial cells.

While a combined satellite/cellular network overcomes many of the disadvantages associated with traditional cellular systems, providing user terminal handsets for such systems that meet consumer expectations regarding size, weight, cost, ease of use and communications clarity is a significant challenge. Consumer expectations in this regard have been defined by the radiotelephones used with conventional cellular systems, which only require a single transceiver and which communicate with base stations that typically are located within 20 miles from the mobile user terminals. By way of contrast, the handheld user terminals which will be used in the integrated cellular/satellite systems include both a cellular and a satellite transceiver with the satellite communications subsystem having sufficient power and antenna gain to establish a link with a satellite that may be 25,000 or more miles away. Moreover, the satellite transceiver preferably should provide a quasi-hemispherical antenna radiation pattern (to avoid having to track the satellite) and should transmit and receive circularly polarized waveforms (to minimize the signal loss resulting from the arbitrary orientation of the transmit and receive antennas and to avoid the effects of Faraday rotation in the ionosphere). The satellite transceiver should also operate over the full extent of potentially widely separated transmit and receive satellite frequency bands.

In light of the above constraints, there is a need for handheld satellite transceivers, and more specifically, antenna systems for such transceivers, capable of transmitting and receiving circularly polarized waveforms which provide a relatively high gain quasi-hemispherical radiation pattern over separate, relatively broadband, transmit and receive frequency subbands. Moreover, given the handheld nature of the user terminals and consumer expectations regarding size and ease of portability, the satellite antenna system capable of meeting the aforementioned requirements should fit within an extremely small physical volume. These user imposed size constraints may also place limitations on the physical volume required by the antenna feed structure and any matching, switching or other networks required for proper antenna operation.

Microstrip or "patch" antennas are relatively small, low profile antennas that are well suited for various applications requiring a quasi-hemispherical radiation pattern. The radiating structure of a patch antenna consists of two parallel conducting layers separated by a thin dielectric substrate. Patch antennas are typically conformable to both planar and non-planar surfaces, inexpensive to manufacture and mechanically robust. The most common patch antennas are rectangular and circle patch antennas.

While patch antennas may be designed to provide the quasi-hemispherical radiation pattern necessary for mobile satellite communications, the bandwidth of these antennas is typically only a fraction of a percent of the carrier frequency and at most a few percent. As discussed above, certain emerging cellular and satellite phone applications have relatively large transmit and receive frequency bands, each of which typically exceed the bandwidth provided by conventional patch antennas. Furthermore, while there are methods that can be used to increase the bandwidth of these antennas, such as by increasing the height of the substrate, these methods may not be suitable for cellular/satellite systems due to constraints on the size of the antenna.

Moreover, the bandwidth over which conventional patch antennas effectively operate may also be limited by power transfer considerations. This limitation occurs because the power transfer between the antenna and the transceiver typically is not lossless due to reflections which arise as a result of imperfect impedance matching. If large enough this reflected power loss, which may be expressed in terms of voltage standing wave ratio ("VSWR"), may prevent the communications system from meeting its link budgets.

While it may be possible to match the input impedance of the patch antenna to the impedance of the interconnecting transmission line(s) from the transceiver, such a match will only occur over a small frequency range as the input impedance of a patch antenna varies significantly with frequency. Accordingly, even if a perfect match (i.e., VSWR=1.0) is not required, an acceptable match will typically still only be achievable over some finite bandwidth. This bandwidth may be less than the operating bandwidth required by emerging cellular and satellite phone applications. As such, impedance mismatches may also serve to limit the effective bandwidth of patch antenna systems.

Dual-band patch antennas are known in the art. However, these prior art antenna systems typically used two separate patch antennas, such as side-by-side patch antennas or stacked patch antennas, to solve the problem of communicating over widely separated transmit and receive frequency bands. Such solutions not only disadvantageously increase the size of the antenna system, but in the case of side-by-side patch antennas, also result in sub-optimal radiation patterns due to the asymmetry of the geometry of the patch in conjunction with the small ground plane. Accordingly, a need exists for a new, low profile, satellite phone antenna system that is capable of providing a quasi-hemispherical antenna pattern with positive gain over widely separated, relatively broadband, transmit and receive frequency bands.

SUMMARY OF THE INVENTION

In view of the above limitations associated with existing antenna systems, it is an object of the present invention to provide physically small patch antenna systems for satellite and cellular phone networks.

Another object of the present invention is to provide a patch antenna system capable of providing a radiation pattern with a positive gain, quasi-hemispherical radiation pattern over separate transmit and receive frequency bands.

A third object of the present invention is to provide a patch antenna system capable of providing a good impedance match over a broad band of operating frequencies.

These and other objects of the present invention are provided by physically small patch antenna systems which capitalize on the size, gain, polarization, and radiation pattern characteristics achievable with patch antennas, while avoiding the bandwidth limitations of such antennas. The present invention uses switched transmit and receive circuit branches which allow the antenna to resonate in separate transmit and receive frequency bands. Additionally, these transmit and receive circuit branches may further include impedance matching networks to increase the operating bandwidth of the antenna in both the transmit and receive frequency bands.

In a preferred embodiment of the present invention, a patch antenna is provided, which is associated with first and second circuit branches that may include reactive elements for changing the resonant frequency of the patch antenna to first and second resonant frequencies. Also included are selection means for electrically coupling the patch antenna to one of the first or second circuit branches while electrically isolating the other of the first or second circuit branches from the patch antenna. These selection means may comprise a switch interposed along each electrical connection between the patch antenna and the first and second circuit branches. Further included are coupling/branch selection means for electrically connecting either the first or second circuit branch to the receiver and for coupling the transmitter to the other of the first and second circuit branches. This antenna system can be provided as a component of a handheld transceiver that further includes a transmitter, a receiver, and a user interface.

In another aspect of the present invention, the antenna system may further include first and second matching circuits for increasing the operating bandwidth of the antenna about the first and second resonant frequencies. These matching circuits may be implemented as part of the first and second circuit branches, or may comprise stand alone circuits.

In certain embodiments of the present invention, the patch antenna is excited by a single feed, which is electrically coupled to the first and second circuit branches. In other embodiments, however, the patch antenna is excited by first and second feeds. In such dual feed embodiments, the first and second feeds may be arranged orthogonally and the patch antenna may be excited in phase quadrature.

In another embodiment of the present invention, the coupling/branch selection means may comprise a 90° hybrid coupler and switching means for coupling the outputs of the 90° hybrid coupler to either the first circuit branch or to the second circuit branch. Alternatively, the coupling/branch selection means may comprise a transmit 90° hybrid coupler for coupling the signal from the transmitter to the first circuit branch and a receive 90° hybrid coupler for coupling the signal from the second circuit branch to the receiver.

Thus, through the use of switched circuit elements and/or matching means, the patch antenna systems of the present invention provide for communications over separate transmit and receive frequency bands with the gain, bandwidth, polarization, and radiation pattern characteristics necessary for emerging mobile satellite communications applications, in a physical package which is conveniently small and meets consumer expectations relating to ease of portability.

BRIEF DESCRIPTION OF THE DRAWINGS

FIG. 2(*b*) is a perspective view of a patch antenna according to the present invention;

FIG. 4 depicts the equivalent circuits for various methods for feeding a patch antenna;

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Additionally, while the antenna systems of the present invention are particularly well-suited for certain satellite communications applications, it will be understood by those of skill in the art that these antenna systems may be advantageously used in a variety of applications, including various point-to-point and traditional cellular communications systems, and thus the present invention should not be construed as limited in any way to antenna systems for use with satellite communication terminal handsets. Like numbers refer to like elements throughout.

Figure 1:
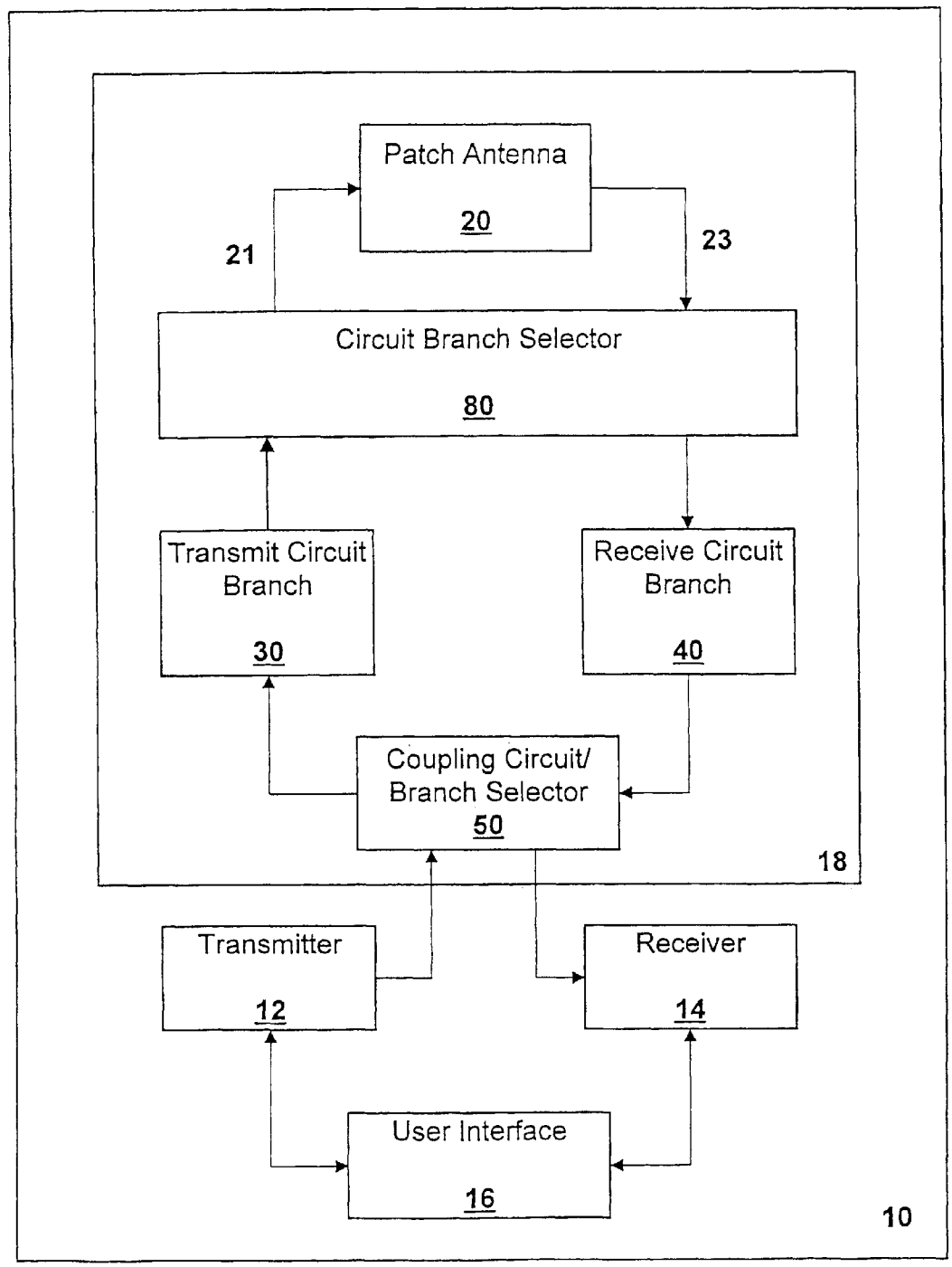
FIG. 1 is a block diagram of a radiotelephone which includes a patch antenna system according to the present invention.

An embodiment of a handheld wireless communications terminal 10 according to the present invention is depicted in the block diagram of FIG. 1. Terminal 10 generally comprises a transmitter 12, a receiver 14, a user interface 16 and an antenna system 18. A wide variety of transmitters 12 and receivers 14 which are suitable for use with a handheld radio communications terminal are known to those of skill in the art, and thus will not be discussed further. Similarly, user interfaces 16 such as microphones, keypads, rotary dials suitable for use in handheld radio communications terminals are also well known in the art.

As illustrated in FIG. 1, the antenna system 18 of the handheld terminal 10 includes a patch antenna 20, a circuit branch selector 80, a transmit circuit branch 30, a receive circuit branch 40 and a coupling circuit/branch selector 50. As discussed herein, antenna system 18 provides for dual-band, wireless communications and is capable of meeting the stringent gain, bandwidth, radiation pattern and other requirements of emerging cellular/satellite phone applications.

As depicted in FIG. 1, patch antenna 20 is coupled to a circuit branch selector 80. This circuit branch selector 80 may operate to couple the transmit circuit branch 30 to patch antenna 20 during periods of transmission, and to couple the receive circuit branch 40 to antenna 20 when handset 10 is operating in receive mode. The transmit and receive circuit branches 30, 40 are provided for adjusting the resonant frequency of the patch antenna 20. For instance, in the case of an antenna system for use with a satellite system with separate transmit and receive frequency bands, transmit circuit branch 30 may be used, if necessary, to tune antenna 20 to resonate in the transmit frequency band, while receive circuit branch 40 may similarly be used, if necessary, to tune antenna 20 to resonate in the receive frequency band. Thus, the transmit and receive circuit branches 30, 40 allow a relatively narrowband patch antenna to operate in two separate frequency bands by providing means for resonating the antenna at two separate frequencies. As illustrated in FIG. 1, antenna system 18 may further include coupling circuit/branch selector 50 which operates to couple patch antenna 20 to transmitter 12 and receiver 14 and to select the appropriate circuit branch 30, 40.

The antenna system depicted in FIG. 1 operates as follows. When the user handset 10 is in the receive mode, circuit branch selector 80 forms an open circuit between transmit circuit branch 30 and patch antenna 20, while electrically coupling patch antenna 20 to receive circuit branch 40. Conversely, when the user handset 10 is in the transmit mode, circuit branch selector 80 forms an open circuit between receive circuit branch 40 and patch antenna 20, while electrically coupling patch antenna 20 to transmit circuit branch 30. In a similar fashion, coupling circuit/branch selector 50 feeds the source signal from transmitter 12 to transmit circuit branch 30 during periods of transmission, whereas in receive mode, coupling circuit/branch selector 50 feeds the received signal from receive circuit branch 40 to receiver 14. Thus, circuit branch selector 80, in conjunction with transmit and receive circuit branches 30, 40 and coupling circuit/branch selector 50, allows for half-duplex communications in two separate frequency bands through a single patch antenna 20.

Figure 2A:
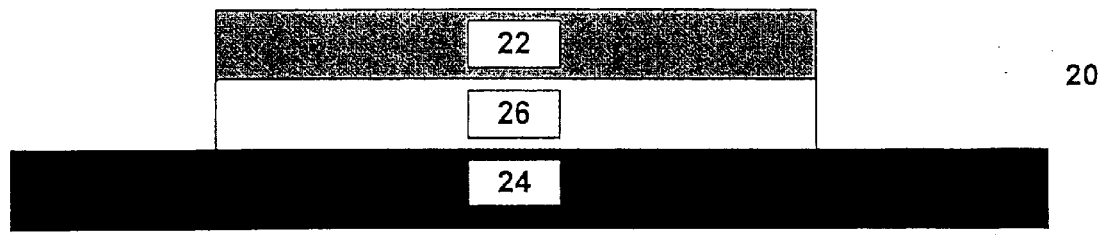
FIG. 2(*a*) is a cross-section view of a patch antenna according to the present invention.
Figure 2B:
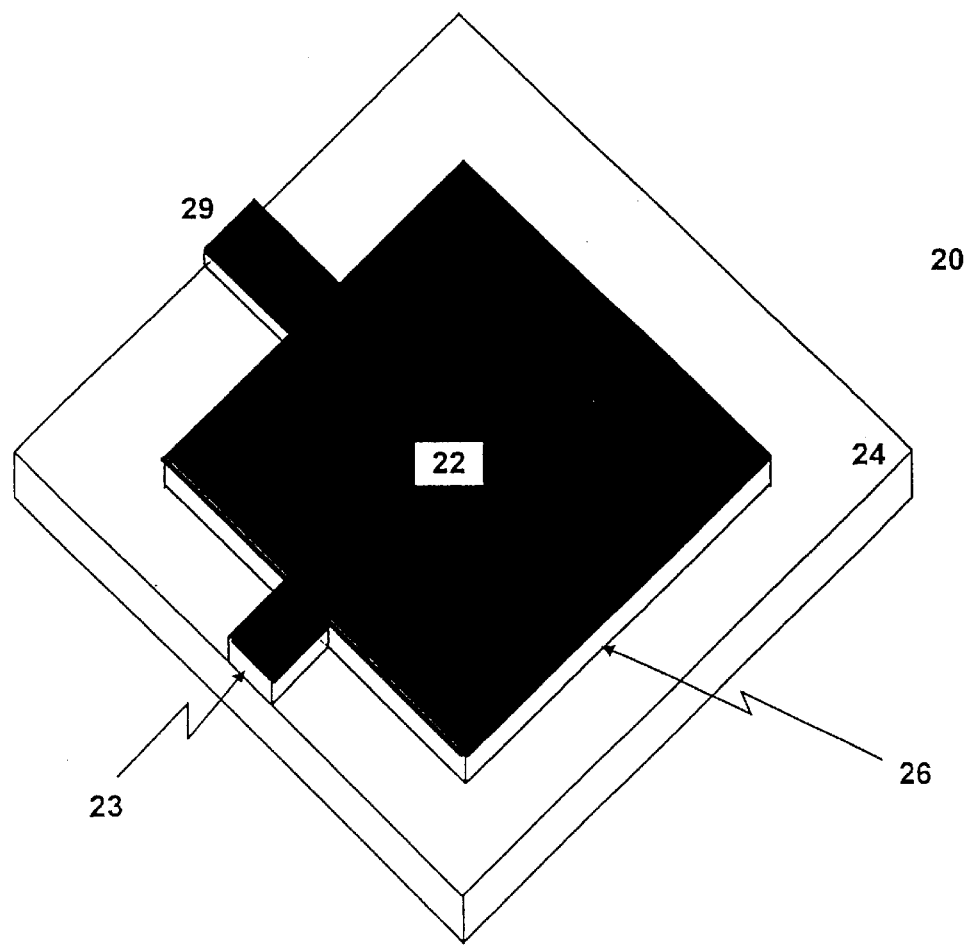

FIGS. 2(a) and 2(b) depict a patch antenna 20 which could be employed with the present invention. As illustrated in FIGS. 2(a) and 2(b), patch antenna 20 is comprised of two generally parallel conducting plates 22, 24 which are separated by a thin dielectric substrate 26, such as fiberglass, TEFLON, polyimide or the like. Conducting layers 22, 24 are typically formed from copper and configured as one or more circular or rectangular plates, although "dipole" patches and various other shapes may also be used. Thus, while the figures herein depict rectangular patch antennas, antenna systems including other patch antenna configurations, specifically including arrays of patch antennas, are within the scope of the present invention.

In operation, lower conductor 24 functions as a ground plane, and the upper conductor 22 serves as the radiating J structure. The patch antenna is typically designed so that its pattern is normal to the patch (a broadside radiator), although end-fire radiation can also be accomplished. As will be understood by those of skill in the art, by properly choosing the particular patch shape and mode, it is possible to both select a particular frequency at which the patch antenna will resonate and configure the patch to provide a positive gain, quasi-hemispherical radiation pattern.

As will also be understood by those of skill in the art, patch antennas may be fed directly by microstrip or coaxial feeds, or indirectly via aperture-coupled or proximity coupled feeds. While the patch antenna systems of the present invention may be fed in any conventional manner, in a preferred embodiment, microstrip feed lines are used to couple signals to and from antenna 20. As discussed herein, this feed approach facilitates various compact implementations of the antenna feed circuitry, including implementations which advantageously locate the antenna feed and matching networks in very close proximity to antenna 20, thereby minimizing any stray inductances which could negatively impact antenna performance.

As will be understood by those of skill in the art, conventional rectangular patch antennas radiate primarily linearly polarized waves if conventional feed methods are used. However, as discussed above, linear polarized waves may be unsuitable for various satellite communications applications where the relative orientation of the transmit and receive antennas is arbitrary or where the link budgets cannot withstand the loss in received signal strength which may occur as a result of Faraday rotation effects. However, circular polarizations can be obtained in patch antennas by exciting two orthogonal modes with a 90° time-phase difference between them. In a square patch, this can conveniently be accomplished by feeding the patch at two adjacent edges, as shown in FIG. 2(b), with equal amplitude signals that are separated in phase by 90°. As will be understood by those of skill in the art, various other dual feed arrangements may be used to obtain circular polarization in patch antennas of other shapes.

While dual feed arrangements can be used to excite essentially ideal circular polarization in patch antennas (and typically maximize the bandwidth which the patch antenna provides), the complexity of the additional feed, and the effect it may have on requiring redundant circuitry in the antenna subsystem, may make single feed arrangements attractive. Accordingly, in a preferred embodiment of the present invention, a single feed patch antenna is provided that achieves circular polarization by exciting two orthogonal degenerate modes of ideally equal amplitudes. As explained in Constatine Balinas, *Antenna Theory Analysis and Design*, p. 768, ($2^{nd}$ Ed. 1997), by designing the patch to have the proper asymmetry, the antenna can be configured so that one mode will lead by 45° while the other lags by 45°, resulting in the 90° phase difference necessary for circular polarization. In a rectangular patch this can be accomplished by properly choosing the relative length of the sides of the rectangle and the location of the single feed point.

Figure 3:
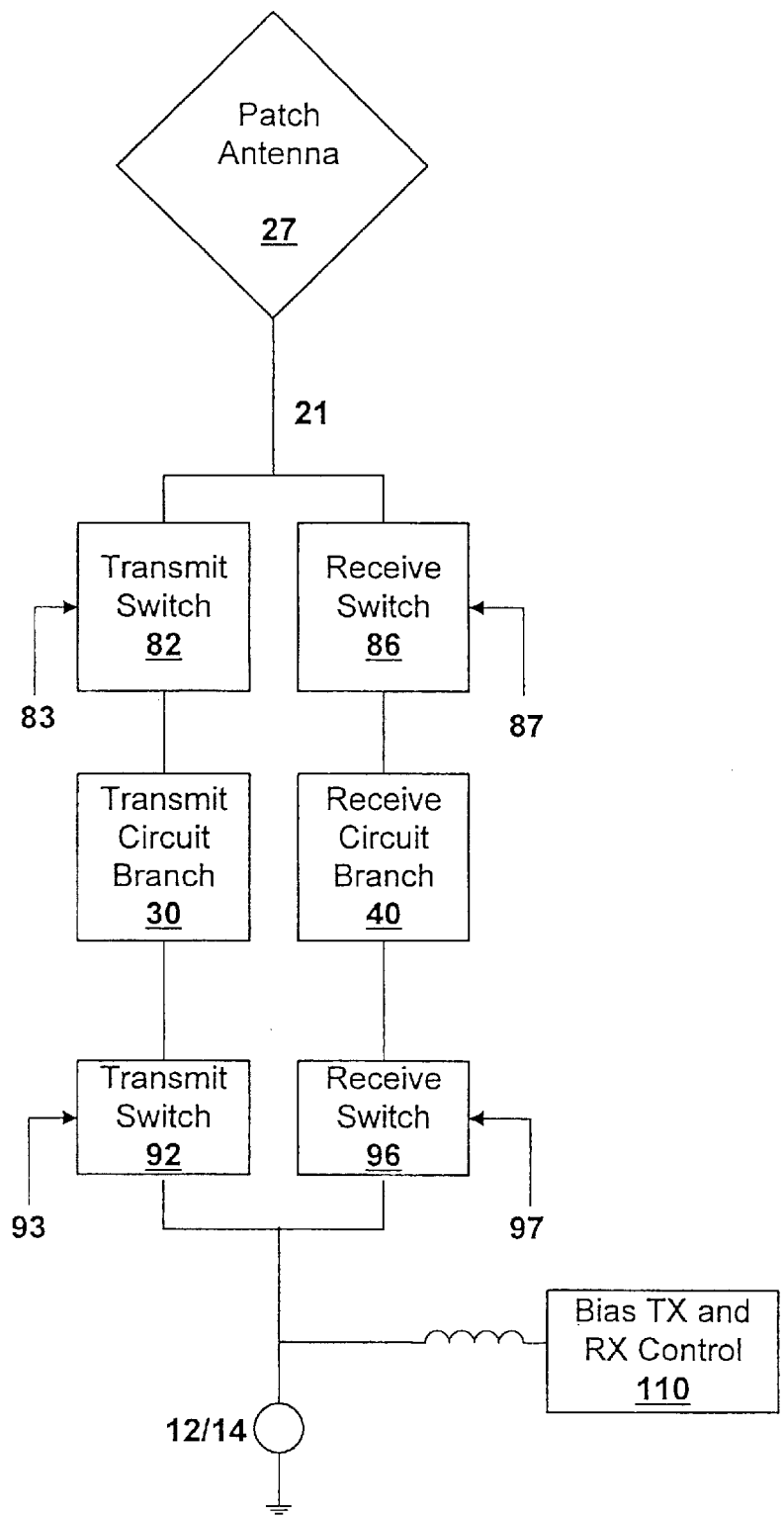
FIG. 3 is a block diagram illustrating one embodiment of the patch antenna systems of the present invention.

A single feed embodiment of the antenna systems of the present invention is illustrated in FIG. 3. In this embodiment, patch antenna 20 of FIG. 1 is a single feed patch antenna 27 which is fed by a single feed 21, and is switchably connected to transmit and receive circuit branches 30, 40, which are provided to facilitate resonating antenna 27 at a minimum of two separate frequencies. When this embodiment of antenna system 27 is used in a satellite communications system, transmit circuit branch 30 may be used to change the resonant frequency of antenna 27 to correspond to approximately the center frequency of a transmit frequency band, while receive circuit branch 40 may similarly be used to change the resonant frequency of the antenna 27 to correspond to approximately the center frequency of a receive frequency subband. Accordingly, transmit and receive circuit branches 30, 40 provide means for resonating antenna 27 in two separate frequency bands to provide a patch antenna system capable of supporting mobile communications applications which use separate transmit and receive frequency bands.

In the embodiment of the present invention illustrated in FIG. 3, transmit and receive circuit branches 30, 40 may be implemented as reactive elements which are coupled to patch antenna 27. By way of background, the equivalent circuit of various feeds to a patch antenna are depicted in FIG. 4. As will be understood by those of skill in the art, the resonant frequency of the antenna is the resonant frequency associated with the equivalent circuit corresponding to the feed that is used to excite the antenna. Accordingly, by coupling one or more additional reactive components (e.g., another capacitor or inductor) in series and/or in parallel to the feed to patch antenna 27, it is possible to modify the equivalent circuit, thereby changing the resonant frequency of the antenna. Generally speaking, if a net capacitance is coupled in series or shunt to antenna feed 21, antenna 27 may be tuned to resonate at a frequency higher than its natural resonant frequency. Similarly, if a net inductance is coupled in series or shunt to antenna feed 21, antenna 27 may be tuned to resonate at a frequency lower than its natural resonant frequency. As will be understood by those of skill in the art, transmit and receive circuit branches 30, 40 need not be implemented as one or more capacitors or inductors but instead may be implemented as any combination of reactive elements that effectively change the resonant frequency of the equivalent circuit for patch antenna 27.

While FIG. 3 depicts both a transmit 30 and receive 40 circuit branch, those of skill in the art will understand in light of the present disclosure that the patch antenna 27 may be designed to resonate at approximately the center frequency of either the transmit or receive frequency band. In this case, it is only necessary to include reactive components in one of the transmit 30 or receive 40 circuit branches for changing the resonant frequency of patch antenna 27, as the antenna is already pre-tuned to one of the intended frequency bands of operation. Thus, for example, if antenna 27 is designed to resonate in the receive frequency band, then receive circuit branch 40 would merely comprise a transmission line or other means of coupling a signal received from antenna 20 to coupling circuit/branch selector 50, as there would be no need to change the resonant frequency of antenna 27 during operation in the receive mode.

As illustrated in FIG. 3, both the transmit and receive circuit branches 30, 40 are coupled to patch antenna 27. Accordingly, it is possible that received energy may be coupled into the transmit circuit branch 30 or that energy induced into the antenna 27 from the transmitter 12 may be coupled into the receive circuit branch 40. Such coupling is generally considered undesirable because it reduces the power that is transferred to the antenna 27 for transmission or that is transferred to the receiver 14 when the communications handset 10 operates in receive mode. Moreover, while the reactive elements that may be included in transmit and receive circuit branches 30, 40 typically help reduce such unwanted coupling, these components may not provide sufficient isolation for some cellular and satellite phone applications.

As discussed above, pursuant to the teachings of the present invention a circuit branch selector may be provided to further increase the electrical isolation between patch antenna 27 and the "OFF" circuit branch (an "OFF" circuit branch refers to the transmit circuit branch 30 when the user terminal is operating in receive mode, and refers to the receive circuit branch 40 when the terminal is operating in transmit mode). In the embodiment of FIG. 3, circuit branch selector is implemented as a transmit switch 82 interposed between antenna 27 and transmit circuit branch 30, and a receive switch 86 interposed between antenna 27 and receive circuit branch 40. During periods of transmission, bias control circuit 110 triggers bias signal 87, thereby opening receive switch 86 to form an open circuit between patch antenna 27 and receive circuit branch 40. Similarly, when the antenna operates in receive mode, bias control circuit 110 triggers bias signal 83, thereby opening transmit switch 82 to form an open circuit between patch antenna 27 and transmit circuit branch 30. When such an open-circuit is provided, the "ON" circuit branch essentially operates as if the "OFF" circuit branch was not present.

As will be understood by those of skill in the art, circuit branch selector 80 of FIG. 1 need not actually provide a true open circuit in order to effectively electrically isolate the patch antenna 27 from the circuit branch 30, 40 which is not in use; instead circuit branch selector 80 need only provide sufficient impedance such that only a minimal amount of energy is coupled into the feed network which is not in use. Various means of providing such an "open circuit" are known to those of skill in the art, including electrical, electromechanical and mechanical switching mechanisms, as well as through the use of duplexers or other reactive impedance-transforming implementations that are known to those of skill in the art. However, electrical switches are preferred, due to their reliability, low cost, small physical volume and ability to switch on and off at the high speeds required by emerging digital communications modes of operation. These electrical switches can readily be implemented as small surface mount devices on the stripline or microstrip printed circuit board that contains the transmit and receive antenna feed networks 30, 40.

In one embodiment of the present invention, switches 82, 86 are implemented as PIN diodes. A PIN diode is a semiconductor device that operates as a variable resistor over a broad frequency range from the high frequency band through the microwave frequency bands. These diodes have a resistance of less than 1 ohm when in a forward bias condition, but when zero or reverse biased, they behave as a small capacitance of approximately one picofarad shunted by a large resistance of as much as 10,000 ohms. When necessary, this shunt capacitance may be anti-resonated. Thus, in forward bias mode, the PIN diode acts as a short-circuit, while in reverse bias mode, the PIN diode effectively acts as an open-circuit.

Figure 8A:
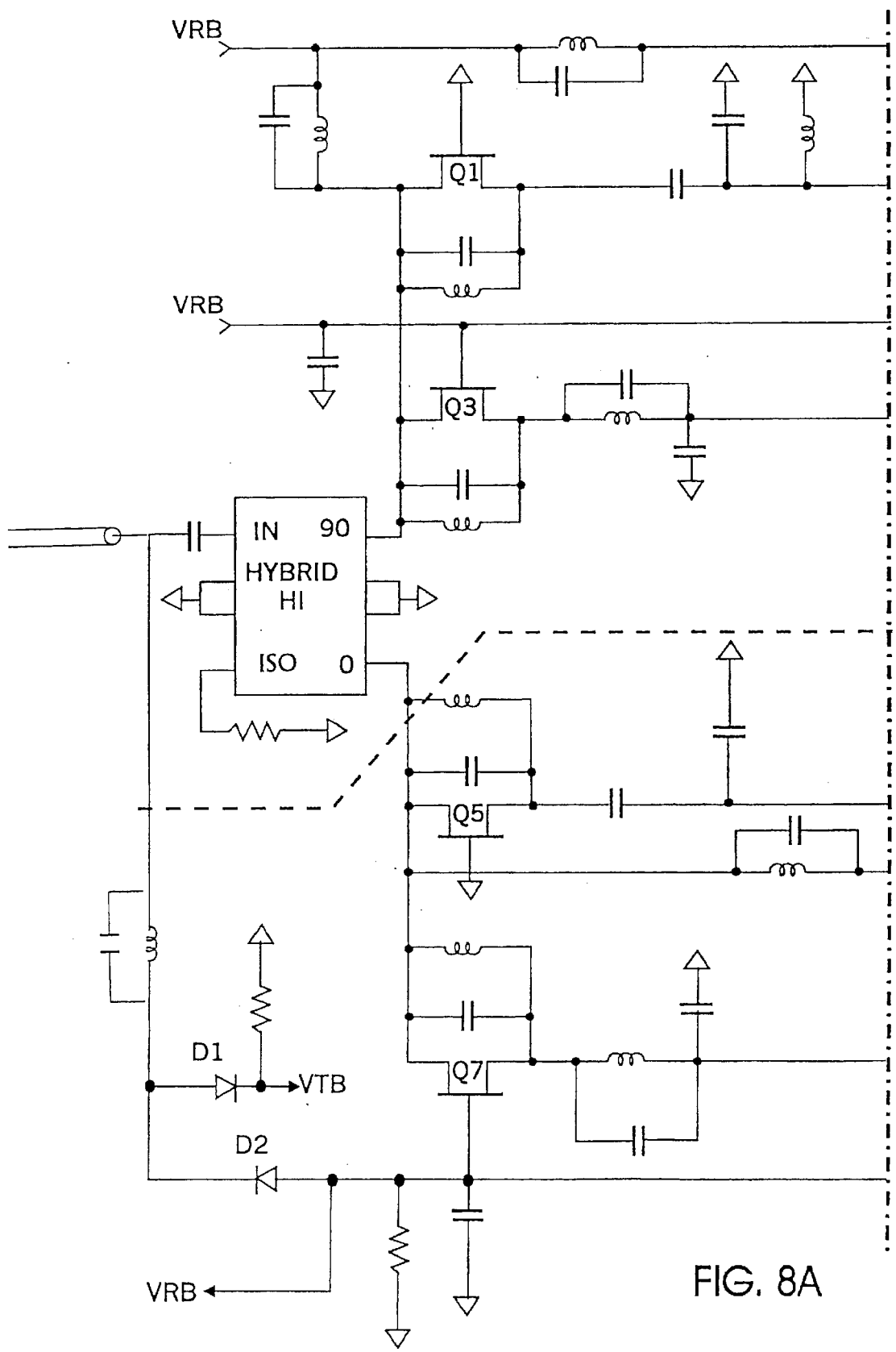
FIGS. 8A and 8B are circuit diagram illustrating an embodiment of the antenna systems according to the present invention.
Figures 8, 8B:
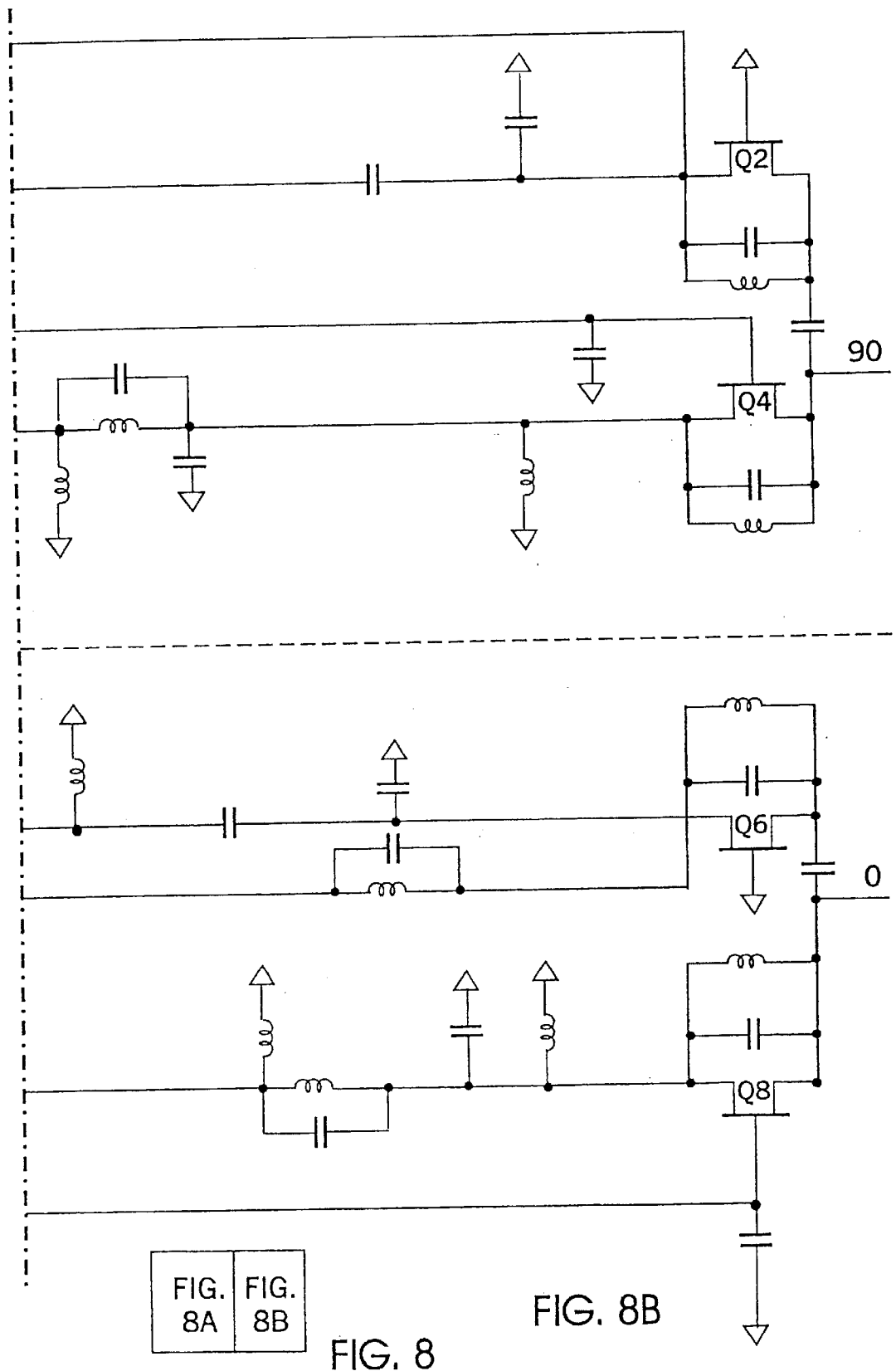

In an alternative embodiment, Gallium arsenide field effect transistors (GaAs FETs) are used instead of PIN diodes to implement switches 82, 86. These devices may be preferred over PIN diodes because they operate in reverse bias mode when a bias signal is absent, thereby avoiding the power drain inherent with PIN diodes which require a bias current for forward bias operation. Moreover, as shown in FIG. 8, each GaAs FET uses an inductor to anti-resonate and therefore isolate the switch in the "OFF" mode. This operation significantly increases the electrical isolation of the "OFF" circuits. In the "ON" mode, the inductor is rendered desirably ineffective as it is shorted by the "ON" resistance of the associated GaAs FET. Furthermore, the drains and sources of the GaAs FET switches are operated at direct current ground potential and resistance. This attribute renders these GaAs FET free from ordinary electrostatic discharge concerns typically associated with use of GaAs FETs near antenna circuitry.

In the embodiment of FIG. 3, the transmitter 12 is coupled to transmit circuit branch 30 via transmit switch 92, and the receiver 14 is similarly coupled to receive circuit branch 40 via receive switch 96. As with switches 82, 86 described above, switches 92, 96 may be implemented as any electrical, electromechanical and mechanical switching mechanisms known to those of skill in the art, as well as through the use of duplexers or other reactive impedance-transforming implementations that are known to those of skill in the art. However, GaAs FET and/or PIN diode switches are once again preferred for the reasons described above. As with bias signals 83, 87, bias signals 93, 97 are controlled by bias control circuit 110.

Figure 5:
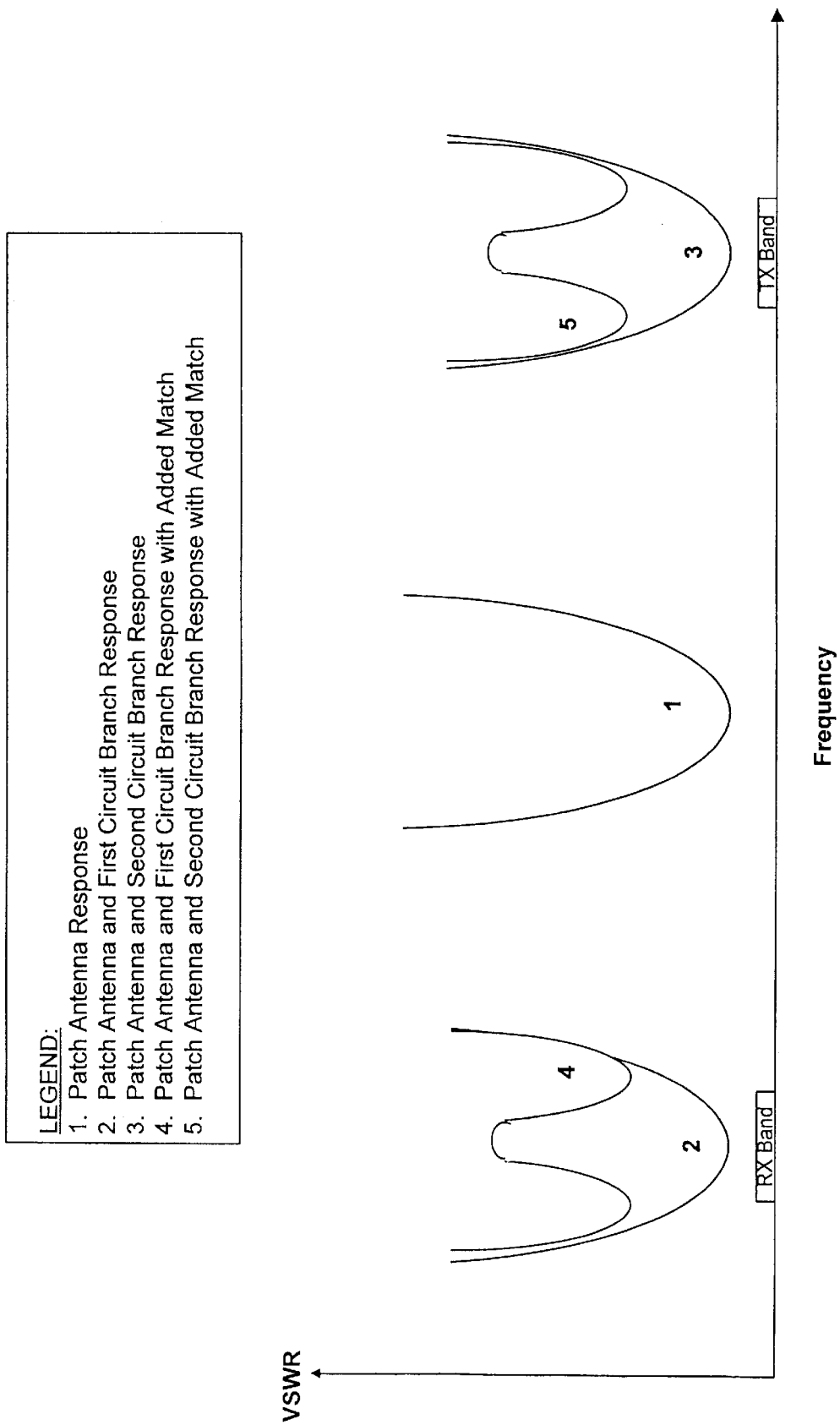
FIG. 5 is a graph of the frequency response achievable with the patch antenna systems according to the present invention.

As discussed above, the useable bandwidth of a patch antenna (which may be specified as the bandwidth for which the VSWR at the output of transceiver 12/14, is less than some level) is typically on the order of 1% or less of the resonant frequency. This occurs because while the antenna typically has a near resonant resistance at the center of the transmit and receive frequency bands, there is a high series equivalent reactance at the low and high ends of these bands, as is generally shown in FIG. 5. Unfortunately, as a result of this increasing reactance away from the resonant frequency, the bandwidth of the antenna 20 may be less than the communications bandwidths specified in emerging cellular and satellite communications systems.

Because of these bandwidth limitations, it may be desirable to include one or more bandpass circuits for increasing the bandwidth over which the antenna system 18 will operate with a voltage standing wave ratio below some specified level. Such impedance matching is possible because the radiation pattern associated with antenna 20 on the mobile cellular and satellite phone system user terminal 10 generally does not require that the driving point impedance be resonant, but instead only requires that a reasonable conjugate match be provided between antenna system 18 and transmitter 12 or receiver 14. Thus, according to the principles of what has become known as "Fano's Law" and which are generally outlined in R. M. Fano, "*Theoretical Limitations on the Broadband Matching of Arbitrary Impedance,*" J. Franklin Inst., February, 1950, pp. 139–154, impedance matching circuits may be employed to increase the bandwidth over which the impedance of antenna system 18 and transmitter 12 or receiver 14 are sufficiently matched to allow for acceptable communications quality. As will be understood by those of skill in the art, a variety of different matching networks may be employed to provide such improved broadband impedance matching. Generally, computer aided design techniques are used to derive an optimum topology for the impedance matching network and to determine component values, as discussed in William Sabin, *Broadband HF Antenna Matching with ARRL Radio Designer*, QST MAGAZINE, August, 1995, pp. 33–36.

In a preferred embodiment of the present invention, the impedance matching networks are implemented as part of transmit circuit branch 30 and receive circuit branch 40. Such an arrangement may reduce the total number of reactive components required to adjust the resonant frequency of antenna 20 and improve its broadband response, thereby reducing the size, weight, power requirements and cost of the antenna system 18. One such implementation of an antenna system according to the present invention that includes such combined matching and frequency change circuitry is illustrated in FIG. 8.

As will be understood by those of skill in the art, the inclusion of matching circuitry may often be required with a single-feed embodiment of the patch antenna system 18 of the present invention, as the single-feed approach for generating circularly polarized waveforms may further restrict the communications bandwidth provided by patch antenna 27. However, it will be understood that the present invention does not require the inclusion of such matching circuits in the single-feed embodiment, nor is the inclusion of matching circuits limited to the single-feed embodiments of the antenna systems of the present invention.

Figure 6:
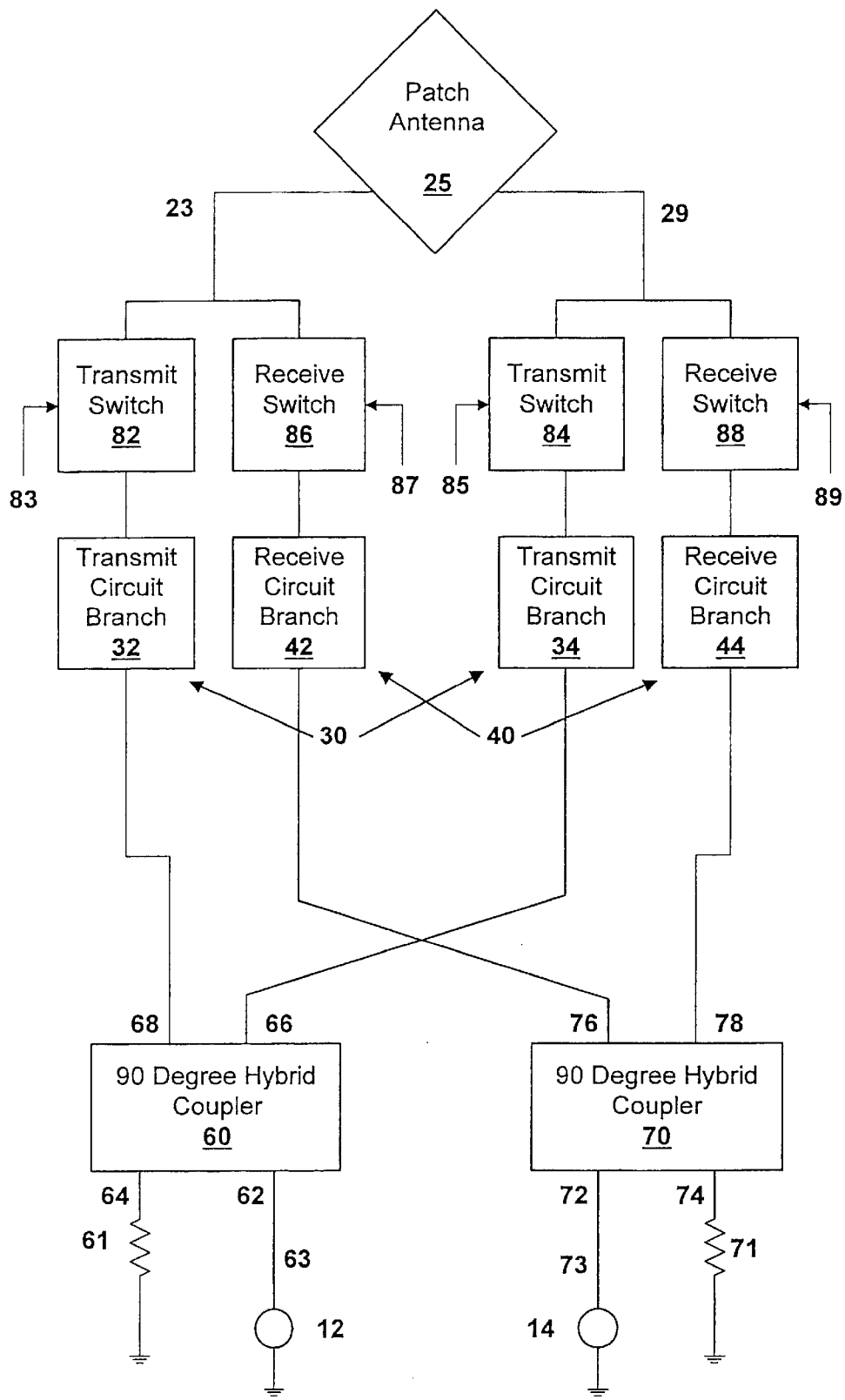
FIG. 6 is a block diagram illustrating a second embodiment of the patch antenna systems of the present invention.

A dual-feed embodiment of the patch antenna system 18 of the present invention is depicted in FIG. 6. In this embodiment, patch antenna 20 of FIG. 1 is a dual feed patch antenna 25 which is fed by quadrature feeds 23, 29. To generate the in-phase and quadrature phase signals which may be used to provide circularly polarized waveforms, coupling circuit/branch selector 50 is implemented as a pair of 90° hybrid couplers 60, 70. As illustrated in FIG. 6, 90° hybrid coupler 60 has inputs 62, 64 and outputs 66, 68. Input 62 is coupled to the transmission signal source 12 through coaxial cable 63, and input 64 is coupled to ground through a resistive termination 61. Coupler 60 divides the input source signal from transmitter 12 into two, equal amplitude output signals, which are offset from each other by 90° in phase. The signal fed through output port 68 is coupled to the in-phase branch 32 of transmit circuit branch 30, and the signal fed through output port 66 is coupled to the quadrature-phase branch 34 of transmit circuit branch 30.

As is also illustrated in FIG. 6, the receive aspects of the antenna system may be implemented in a manner similar to the transmit aspects, except that the receive components combine and deliver induced power from antenna 25 to receiver 14 as opposed to delivering a signal to the antenna 20 for radiation. Accordingly, 90° hybrid coupler 70 having output ports 72, 74 and input ports 76, 78 is used to combine the energy received by patch antenna 25 and deliver this induced power to receiver 14. Input port 76 of 90° hybrid coupler 70 is coupled to the in-phase branch 42 of receive circuit branch 40, and input port 78 is coupled to the quadrature-phase branch 44 of receive circuit branch 40. Output port 72 is coupled to receiver 14 through a coaxial cable 73, and output port 74 is coupled to ground through resistor 71. As illustrated in FIG. 6, circuit branches 30, 40 and circuit branch selector 80 may be implemented in a manner very similar to that shown in FIG. 3 and described above, except for the fact that two of each component are required—one for the in-phase branch and one for the quadrature-phase branch.

As will be understood by those of skill in the art, 90° hybrid couplers 60, 70 can be implemented in a variety of different ways, such as distributed quarter-wave length transmission lines or as lumped element devices. In a preferred embodiment, lumped element 90° hybrid splitter/combiners mounted on a stripline or microstrip electronic substrate are used as they can maintain a phase difference of almost exactly 90° between their respective output ports. This is advantageous because if the phase separation between the dual feeds 23, 29 varies from 90°, the antenna pattern provided by patch antenna 25 tends to degrade significantly, and the polarization of the antenna becomes eliptical. In contrast, distributed quarter wavelength branch line couplers or other arrangements utilizing transmission lines only maintain a 90° phase difference between the output ports at frequencies near resonance.

While the embodiment of FIG. 6 requires more components than the embodiment depicted in FIG. 3, the use of 90° hybrid couplers 60, 70 advantageously reduces the effective VSWR seen by transmitter 12 and receiver 14, thereby both improving the link margin and increasing the operating bandwidth over which the antenna may be used. This occurs because these 90° hybrid couplers combine the energy incident at the 0° and 90° ports in such a way as to present the desired signal at the input port of the 90° hybrid coupler while absorbing the reflected signals in the resistive termination. Accordingly, the VSWR measured at transmitter 12 and receiver 14 is only a very minimal portion of the VSWR measured at the ports of the 90° hybrid couplers proximate antenna 25. Moreover, in the embodiment of FIG. 6, circuit branch selector 80 is implemented as pairs 82, 84; 86, 88 of radio frequency GaAs FET switches, as a result of the requirement for in-phase and quadrature-phase feeds to antenna 25. Accordingly, the power handled by each switch 82, 84; 86, 88 is only half the power which would be required if a single switch was used to isolate each of the separate circuit branches (as is the case in the embodiment of FIG. 3). This is significant because currently available GaAs FETs have a power level above which undesired signal compression can occur, and the embodiment of FIG. 6 reduces the possibility of this occurring by requiring that only half the power pass through each GaAs FET switch 82, 84; 86, 88.

Figure 7:
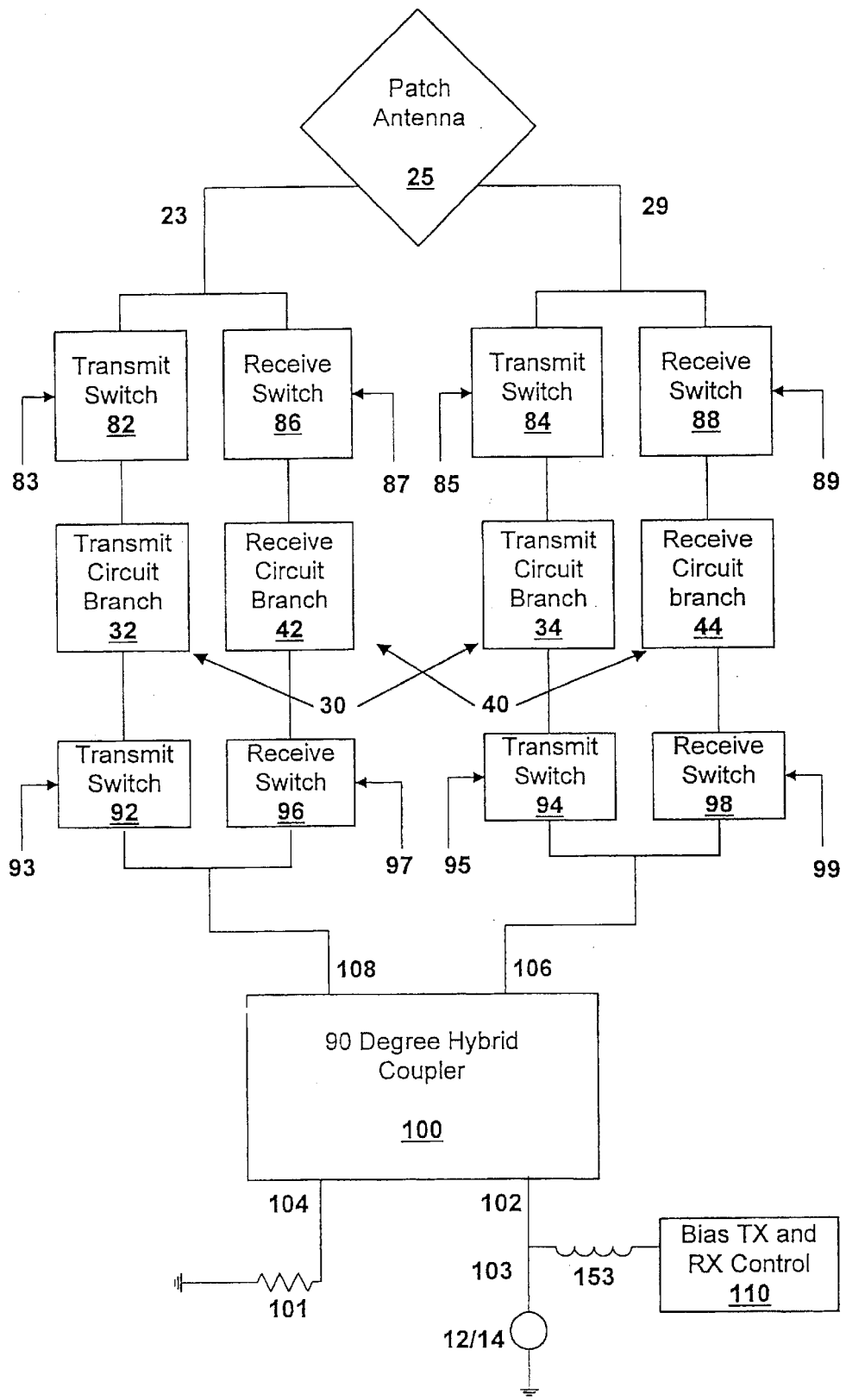
FIG. 7 is a block diagram illustrating a third embodiment of the patch antenna systems of the present invention.

An alternative dual feed embodiment of the antenna system of the present invention is illustrated in FIG. 7. This embodiment differs from the embodiment illustrated in FIG. 6 in that a single 90° hybrid coupler 100 is used in conjunction with switching means 92, 94, 96, 98 to couple signals to and from transceiver 12/14 to patch antenna 25 and to select the appropriate circuit branch 30, 40. As illustrated in FIG. 7, 90° hybrid coupler 100 is coupled to both the transmitter 12 and receiver 14 through input 102, while input 104 is coupled to a resistive termination. Outputs 106, 108, are coupled to switching means 92, 94, 96, 98. Thus, in this embodiment, only a single 90° hybrid coupler 100 is required, which operates with switching means 92, 94, 96, 98 to feed antenna 25, and this hybrid coupler 100 may be connected to transceiver 12/14 through a single coaxial cable 103.

The feed network illustrated in FIG. 7 operates as follows. During periods of transmission, transceiver 12/14 couples the signal to be transmitted to 90° hybrid coupler 100, which divides the source signal into two equal amplitude output signals, which are offset from each other by 90° in phase. Output 106 couples the signal to switches 94, 98 and output 108 couples the signal to switches 92, 96. Bias control mechanism 110 sends out bias signals 87, 89, 97, 99 which excites switches 86, 88, 96, 98, thereby open-circuiting those switches. At the same time, switches 82, 84, 92, 94 remain closed (short-circuited) thereby allowing the signal to be transmitted to pass through the remaining circuitry in the transmit branch for transmission by antenna 25. As will be understood by those of skill in the art, the embodiment illustrated in FIG. 7 works essentially the same way when in receive mode, except that bias control mechanism 110 activates bias signals 83, 85, 93, 95 which in turn opencircuits switches 82, 84, 92, 94 instead of switches 86, 88, 96, 98. One possible circuit-level embodiment of the antenna system depicted in FIG. 7 is illustrated in FIG. 8.

In another embodiment of the present invention, one or more additional circuit branches may be added to provide for communications in additional frequency bands. For example, additional capability could potentially facilitate using the patch antenna with the conventional cellular transceiver on a satellite-cellular user handset, and/or for operation with a Global Positioning Satellite ("IGPS") transceiver. For instance, to further provide a GPS capability through patch antenna 20 in the satellite terminal handset of FIG. 1, a third circuit branch 39 (not shown in FIG. 1) may be included which is coupled to a GPS transceiver 19 (not shown in FIG. 1). This third circuit branch 39 is coupled to patch antenna 20 through circuit branch selector 80. When user terminal 10 is used for half-duplex satellite communications, circuit branch selector 80 provides an open circuit between third circuit branch 39 and antenna 20 (as well as between whichever of the transmit or receiver circuit branches 30, 40 is not in use). However, when GPS mode is desired, circuit branch selector 80 provides a short circuit between antenna 20 and third circuit branch 39, while isolating transmit and receive circuit branches 30, 40 from antenna 20. Third, circuit branch 39 may then be used to change, if necessary, the resonant frequency of antenna 20 to the GPS frequency band, thereby providing for GPS capability through patch antenna 20.

In another aspect of the present invention, the coupling circuit/branch selector 50, transmit and receive circuit branches 30, 40 and circuit branch selector 80 are all implemented as surface mount components on a stripline or microstrip printed circuit board. In the embodiments of FIGS. 6–8, it is preferable that a multilayer board is used which includes a ground circuit between its top and bottom layers, with the components of the 0° legs of the transmit and receive branch mounted on one side of the board while the components of the 90° legs of the transmit and receive branch are mounted on the opposite side of the printed circuit board. At one end of the printed circuit board, one or more contacts may be provided to couple the feed(s) to patch antenna 25 to the feed circuitry. On the other end of the printed circuit board, provision is made for attaching one or more coaxial transmission lines from the transmitter 12 and receiver 14.

Moreover, in another aspect of the present invention, coupling circuit/branch selector 50, transmit and receive circuit branches 30, 40 and circuit branch selector 80 may all be implemented above the ground plane 24 of patch antenna 20, adjacent to radiating element 22. Through this approach, it is possible to place the antenna feed and matching networks in extremely close proximity to patch antenna 20, thereby minimizing the amount of stray inductance added by the electrical connections between such matching/feed networks and antenna 20. Preferably, all the elements of the switches, feed circuits, matching circuits and other non-antenna components of antenna system 18 are positioned less than 3 centimeters from the origin of antenna 20. More preferably, these components are positioned less than 2 centimeters from the origin of antenna 20. This approach also potentially provides the thinnest antenna subsystem 18. Moreover, the receiver preselector, the low noise amplifier and the high power amplifier may also conveniently be implemented adjacent to radiating element 22 above ground plane 24, to further reduce thickness and stray inductances.

In the drawings, specification and examples, there have been disclosed typical preferred embodiments of the invention and, although specific terms are employed, these terms are used in a generic and descriptive sense only and not for purposes of limitation, the scope of the invention being set forth in the following claims. Accordingly, those of skill in the art will themselves be able to conceive of embodiments of the antenna system other than those explicitly described herein without going beyond the scope of the present invention.

That which is claimed is:

1. A dual-band antenna system for providing electrical signals to a receiver and for transmitting electrical signals from a transmitter, comprising:
   (a) a patch antenna;
   (b) a first circuit branch having at least one reactive element coupled to said patch antenna for changing the resonant frequency of said patch antenna to a first resonant frequency;
   (c) a second circuit branch coupled to said patch antenna which excites said patch antenna at a second resonant frequency;
   (d) selection means for electrically coupling said patch antenna to one of said first or second circuit branches while electrically isolating the other of said first or second circuit branches from said patch antenna; and
   (e) coupling means for coupling the signal from one of said first or second circuit branches to said receiver and for coupling the signal from said transmitter to the other of said first and second circuit branches.

2. The dual-band antenna system of claim 1, wherein said second circuit branch includes at least one reactive element for changing the resonant frequency of said patch antenna to said second resonant frequency.

3. The dual-band antenna system of claim 1, further comprising a first matching circuit associated with said first circuit branch for increasing the operating bandwidth of said patch antenna about said first resonant frequency and further comprising a second matching circuit associated with said second circuit branch for increasing the operating bandwidth of said patch antenna about said second resonant frequency.

4. The dual-band antenna system of claim 3, wherein said first matching circuit and said first circuit branch are a single circuit, and wherein said second matching circuit and said second circuit branch are a single circuit.

5. The dual-band antenna system of claim 1, wherein said patch antenna is excited by a single feed, and wherein said first and second circuit branches are coupled to said single feed.

6. The dual-band antenna system of claim 1, wherein said patch antenna is excited by a first feed and a second feed, and wherein said first circuit branch comprises at least one reactive element coupled to said first feed and at least one reactive element coupled to said second feed.

7. The dual-band antenna system of claim 6, wherein said second circuit branch includes at least one reactive element coupled to said first feed and at least one reactive element coupled to said second feed for changing the resonant frequency of said patch antenna to said second resonant frequency.

8. The dual-band antenna system of claim 6, wherein said first and second feeds to said patch antenna are arranged orthogonally and wherein said patch antenna is excited in phase quadrature.

9. The antenna system of claim 6, wherein said coupling means comprise a 90° hybrid coupler, and wherein said antenna system further comprises switching means for coupling the outputs of said 90° hybrid coupler to either said first circuit branch or to said second circuit branch.

10. The antenna system of claim 6, wherein said coupling means comprises a transmit 90° hybrid coupler for coupling the signal from said transmitter to said first circuit branch and a receive 90° hybrid coupler for coupling the signal from said second circuit branch to said receiver.

11. The antenna system of claim 1, wherein said selection means comprises a switch interposed along each electrical connection between said patch antenna and said first and second circuit branches.

12. The antenna system of claim 11, wherein said switches are GaAs FET switches, and wherein said antenna system further comprises an inductor associated with each GaAs FET for anti-resonating the GaAs FET in reverse bias mode.

13. The dual-band radiotelephone of claim 1, further comprising a third circuit branch for setting the resonant frequency of said patch antenna to a third resonant frequency, and wherein said selection means further comprises means for electrically coupling said patch antenna to said third circuit branch while electrically isolating said first and second circuit branches from said patch antenna, and wherein said coupling means further comprise means for coupling signals from said third circuit branch to a second transceiver.

14. The antenna system of claim 1, further comprising at least one microelectronic substrate located above a ground plane on said patch antenna and adjacent to a radiating conductor of said patch antenna, and wherein said patch antenna, said coupling means, said first circuit branch, said second circuit branch, and said selection means are on said at least one microelectronic substrate.

15. A dual-band antenna system for use with a transceiver in transmitting and receiving circularly polarized radio signals, said antenna system comprising:
   (a) a patch antenna having a first feed and a second feed which are arranged orthogonally;
   (b) a first circuit branch comprising at least one reactive element coupled to said first and second feeds for changing the resonant frequency of said patch antenna to a first resonant frequency and for increasing the operating bandwidth of said patch antenna about said first resonant frequency;
   (c) a second circuit branch comprising at least one reactive element coupled to said first and second feeds for setting the resonant frequency of said patch antenna to a second resonant frequency and for increasing the operating bandwidth of said patch antenna about said second resonant frequency;
   d) selection means for electrically connecting said patch antenna to one of said first or second circuit branches while electrically isolating the other of said first or second circuit branches from said patch antenna; and
   (e) coupling means for coupling signals from said transmitter to one of said first or second circuit branches in phase quadrature and for combining phase quadrature signals from the other of said first and second circuit branches for coupling to said receiver.

16. The antenna system of claim 15, wherein said selection means comprises a switch interposed along each electrical connection between said patch antenna and said first and second circuit branches.

17. The antenna system of claim 16, wherein said coupling means comprises a 90° hybrid coupler and switching means associated with said 90° hybrid coupler for coupling the outputs of said 90° hybrid coupler to either said first circuit branch or to said second circuit branch.

18. The antenna system of claim 16, wherein said coupling means comprises a transmit 90° hybrid coupler for coupling the signal from said transmitter to one of said first or second circuit branches and a receive 90° hybrid coupler for coupling the signal from the other of said first or second circuit branches to said receiver.

19. A method for transmitting electrical signals from a transmitter and for receiving electrical signals at a receiver using an antenna system comprising a patch antenna and first and second circuit branches for changing the resonant frequency of the patch antenna to first and second resonant frequencies, the method comprising:
 (a) coupling signals received by the patch antenna to the second circuit branch while electrically isolating the transmitter and the first circuit branch from the patch antenna;
 (b) coupling signals from the second circuit branch to the receiver while electrically isolating the transmitter and the first circuit branch from the patch antenna;
 (c) coupling signals from the transmitter to the first circuit branch while electrically isolating the receiver and the second circuit branch from the patch antenna; and
 (d) coupling signals from the first circuit branch to the patch antenna while electrically isolating the receiver and the second circuit branch from the patch antenna.

20. A method according to claim 19, wherein the antenna system further includes a plurality of switches interposed along each electrical connection between the receiver and the patch antenna and between the transmitter and the patch antenna and further comprising the step of activating the switches to electrically isolate the devices which are to be isolated.

21. A dual-band radiotelephone for transmitting and receiving radio frequency signals comprising:
 (a) a transmitter;
 (b) a receiver;
 (c) a user interface;
 (d) a patch antenna;
 (e) a first circuit branch for changing the resonant frequency of said patch antenna to a first resonant frequency;
 (f) a second circuit branch for exciting said patch antenna at a second resonant frequency;
 (g) coupling means for coupling the signal from one of said first or second circuit branches to said receiver and for coupling the signal from said transmitter to the other of said first or second circuit branches; and
 (h) selection means for electrically coupling said patch antenna to either said first circuit branch or said second circuit branch.

22. The dual-band radiotelephone of claim 21, wherein said first circuit branch further comprises means for increasing the operating bandwidth of said patch antenna about said first resonant frequency, and wherein said second circuit branch further comprises means for increasing the operating bandwidth of said patch antenna about said second resonant frequency.

23. The dual-band radiotelephone of claim 21, wherein said patch antenna has a first feed and a second feed which are arranged orthogonally, wherein said first circuit branch comprises at least one reactive element coupled to the first feed to said patch antenna and at least one reactive element coupled to the second feed to said patch antenna, and wherein said second circuit branch comprises at least one reactive element coupled to the first feed to said patch antenna and at least one reactive element coupled to the second feed to said patch antenna.

24. The dual-band radiotelephone of claim 23, wherein said coupling means comprise a 90° hybrid coupler, and further comprising switching means for coupling the outputs of said 90° hybrid coupler to either said first circuit branch or to said second circuit branch.

25. The dual-band radiotelephone of claim 23, wherein said coupling means comprises a transmit 90° hybrid coupler for coupling the signal from said transmitter to said first circuit branch and a receive 90° hybrid coupler for coupling the signal from said second circuit branch to said receiver.

26. The dual-band radiotelephone of claim 23, further comprising a second transmitter, a second receiver and a third circuit branch having at least one reactive elemnt coupled to said patch antenna for setting the resonant frequency of said patch antenna to a third resonant frequency, and wherein said coupling means further comprise means for coupling signals from said third circuit branch to and from said second transmitter and said second receiver, and wherein said selection means further comprises means for connecting said patch antenna to said third circuit branch.

27. The dual-band radiotelephone of claim 23, wherein said first and second circuit branches, said coupling means and said selection means are located above a ground plane of said patch antenna adjacent to a radiating conductor of said patch antenna.

28. The dual-band radiotelephone of claim 27, further comprising a receiver preselector and a low noise amplifier coupled to said receiver, and a high power amplifier coupled to said transmitter, wherein said receiver preselector, said low noise amplifier and said high power amplifier are located above the ground plane of said patch antenna adjacent to a radiating conductor of said patch antenna.

* * * * *